(12) United States Patent
Sasaki et al.

(10) Patent No.: US 7,193,319 B2
(45) Date of Patent: Mar. 20, 2007

(54) SEMICONDUCTOR DEVICE

(75) Inventors: Koji Sasaki, Tsuchiura (JP); Shinji Hiramitsu, Kashiwa (JP); Tadaaki Kariya, Tokai (JP); Satoshi Matsuyoshi, Takahagi (JP); Ryouichi Kajiwara, Hitachi (JP); Shosaku Ishihara, Chigasaki (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/288,098

(22) Filed: Nov. 29, 2005

(65) Prior Publication Data

US 2006/0214291 A1  Sep. 28, 2006

(30) Foreign Application Priority Data

Mar. 25, 2005  (JP) ............... 2005-087481

(51) Int. Cl.
*H01L 23/34* (2006.01)

(52) U.S. Cl. ..................... 257/724; 257/779

(58) Field of Classification Search ............. 257/724, 257/779, 482
See application file for complete search history.

(56) References Cited

U.S. PATENT DOCUMENTS

| 4,349,831 | A | | 9/1982 | Theroux |
| 5,773,885 | A | * | 6/1998 | Steele .............. 257/710 |

\* cited by examiner

*Primary Examiner*—Phat X. Cao
(74) *Attorney, Agent, or Firm*—Antonelli, Terry, Stout and Kraus, LLP.

(57) ABSTRACT

A semiconductor device is provided, in which buffer layers having a coefficient of linear expansion of $3 \times 10-6/°$ C. to $8 \times 10-6/°$ C. are joined to upper and lower surfaces of a silicon chip through a Pb-free solder having a thickness of not more than 0.05 mm and a melting point of not less than 250° C. The upper surface of the upper buffer layer and the lower surface of the lower buffer layer are respectively joined to a lead and a base through Pb-free solders having a thickness of not less than 0.15 mm and a melting point of not less than 250° C.

8 Claims, 4 Drawing Sheets

SEMICONDUCTOR DEVICE

TECHNICAL FIELD

The present invention relates to a semiconductor device, and more particular, to a diode used in alternators for automobiles or the like.

BACKGROUND OF THE INVENTION

An alternator for automobiles is a three-phase alternating current generator, in which electric power is produced from torque obtained by an engine to be fed to a battery, and an alternator diode functions to rectify three-phase alternating current produced by the generator into direct current in order to feed the current to the battery. An alternator diode comprises a silicon (Si) chip having a rectifying function, a lead and a base, which have a current-carrying function, and solder, which joins these elements together, and is structured to fill a resin, such as silicon rubber, etc., inside the base.

When an alternator operates, large current flows through an alternator diode, so that a silicon chip generates heat due to Joule heating and the silicon chip, surrounding solder, a lead and a base become equal to or higher than 200° C. at the highest. When the alternator stops, electric current is not supplied and the alternator diode is cooled to an ambient temperature. Since the alternator repetitively operates and stops over a long term, the alternator diode repetitively undergoes expansion due to heating and contraction due to cooling. At this time, the silicon chip, the lead, and the base are different in coefficient of linear expansion to generate differences in volume of thermal deformation, so that thermal stress is generated in solder, which joins these elements together, to cause a fear that the solder undergoes fatigue failure because of such thermal stress.

Therefore, there is proposed a diode shown in, for example, U.S. Pat. No. 4,349,831, which comprises buffer layers provided between a silicon chip and a lead and between the silicon chip and a base and formed from a material, which is larger in coefficient of linear expansion than that of silicon and smaller than materials of the lead and the base.

BRIEF SUMMARY OF THE INVENTION

In recent years, a tendency of regulating the use of Pb (lead) for electronic parts has become remarkable as influences of Pb on the environment have been revealed. Therefore, development of a Pb-free solder for use with electronic parts has arisen. The Pb-free solder includes Sn—Ag (tin-silver) solder, Sn—Bi (tin-bismuth) solder, etc.

Such Pb-free solder is effective for light electrical appliances, which are used at relatively low temperatures. However, since alternator diodes permitting large current to flow therethrough are large in calorific value and mounted near an engine of an automobile where an ambient temperature is high, temperature in use reaches not less than 200° C. in some cases, so that solder such as Pb-5Sn (a melting point of 296° C.), etc. is conventionally used. In order to avoid melting of solder in use, a Pb-free solder such as Sn—Ag solder, Sn—Bi solder, etc. cannot be used as a material to replace a conventional solder.

It is required that a Pb-free solder having a melting point of not less than 250° C. be used for alternator diodes, the temperature of which becomes not less that 200° C. in use. Candidate materials for a Pb-free solder having a high melting point include pure zinc (Zn, a melting point of 420° C.), Bi-11Ag (a melting point of 350° C., a solidus temperature of 262° C.), Bi-20Ag (a melting point of 390° C., a solidus temperature of 262° C.), Bi-30Ag (a melting point of 420° C., a solidus temperature of 262° C.), Zn-5Al (a melting point of 385° C.), and the like. Since a Pb-free solder having a high melting point generally has a yield stress σy of not less than 25 MPa and a Vickers hardness of not less than 50 Hv at room temperature, and thus the yield stress and the hardness are high as compared with a high-temperature Pb solder of Pb-5Sn (a yield stress σy is about 20 MPa and a Vickers hardness is about 35 Hv). However, expansion at the time of heating generates a high tensile stress in a silicon chip due to differences in coefficient of linear expansion among a lead, a base, buffer layers, or between solder itself and a silicon chip when the Pb-free solder is used as a connection member for alternator diodes, and there is consequently caused a fear of breakage of the silicon chip.

The invention has been thought of to solve the problem and has its object to provide a semiconductor device, in which a Pb-free solder having a high melting point is used as a connection member and a silicon chip is not broken by thermal stress in use and which is high in reliability.

In order to attain the object, the invention provides a structure of a semiconductor device, in which buffer layers are provided above and below a silicon chip, wherein solder having a thickness of not more than 0.05 mm connects between the silicon chip and the buffer layers, and solder having a thickness of not less than 0.15 mm joins between the buffer layer and a lead and between the buffer layer and a base.

Furthermore, the invention has a feature in that the buffer layers have a coefficient of linear expansion of not less than $3 \times 10^{-6}$/° C. and not more than $8 \times 10^{-6}$/° C. In addition, the invention has a feature in that the solder has a melting point of not less than 250° C. and is a Pb-free solder containing no Pb.

According to the invention, a reliable semiconductor device, in which thermal stress generated in a silicon chip at the time of heating is restricted and the silicon chip is not broken, can be obtained by joining buffer layers having a coefficient of linear expansion of $3 \times 10^{-6}$/° C. to $8 \times 10^{-6}$/° C. to upper and lower sides of the silicon chip through solders having a thickness of not more than 0.05 mm, and joining a lead and a base respectively to upper side of the upper buffer layer and lower side of the lower buffer layer through solders having a thickness of not less than 0.15 mm. A Pb-free reliable semiconductor device, which can withstand the use at high temperatures and eliminate breakage of the silicon chip, can be obtained by using a Pb-free solder having a melting point of not less than 250° C. as a solder material.

Other objects, features and advantages of the invention will become apparent from the following description of the embodiments of the invention taken in conjunction with the accompanying drawings.

DETAILED DESCRIPTION OF THE INVENTION

Embodiments of the invention will be described below with reference to the drawings.

Figure 1:
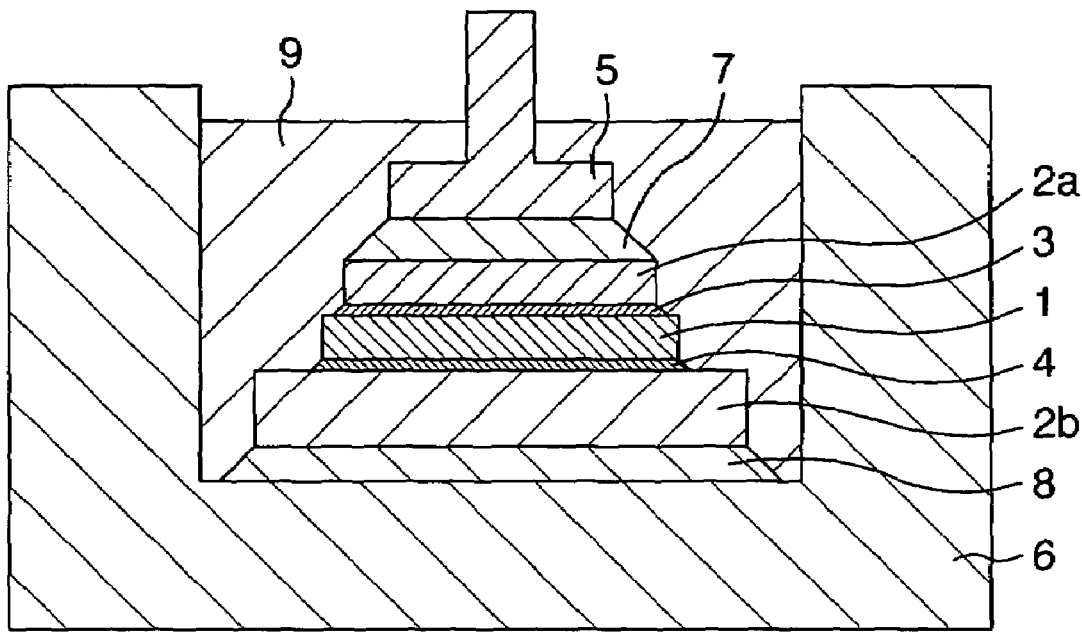
FIG. 1 is a cross sectional view showing a semiconductor device according to an embodiment of the invention.

FIG. 1 shows a cross section of a semiconductor device according to an embodiment of the invention. In the embodiment, buffer layers 2a, 2b are provided above and below a silicon element 1, and solder layers 3, 4 having a thickness of 0.02 mm join the silicon element to the buffer layers. A copper lead 5 and a copper base 6 are provided above and below the buffer layers 2a, 2b, and solder layers 7, 8 having a thickness of 0.02 mm join the upper buffer layer 2a to the lead 5 and join the lower buffer layer 2b to the base 6. With a view to preventing entry of moisture or the like, a sealing resin 9 seals an inside of the base. It is required that the buffer layers 2a, 2b have a coefficient of linear expansion of not less than $3 \times 10^{-6}$/° C. and not more than $8 \times 10^{-6}$/° C. In this case, molybdenum (Mo) having a coefficient of linear expansion of $5.1 \times 10^{-6}$/° C. is used. The same effect can be obtained in case of using tungsten (W) having a coefficient of linear expansion of $4.5 \times 10^{-6}$/° C., Fe-42% Ni (iron-42% nickel) alloy (a common name of 42 alloy) having a coefficient of linear expansion of $5 \times 10^{-6}$/° C., and the like. Zinc (Zn) having a melting point of 420° C. is used for solder. All the four solder layers are preferably made of the same material because all the solder layers can be heated and molten at a time by passage once through a furnace to join silicon pellets, the buffer layers, the lead and the base together.

Figure 2:
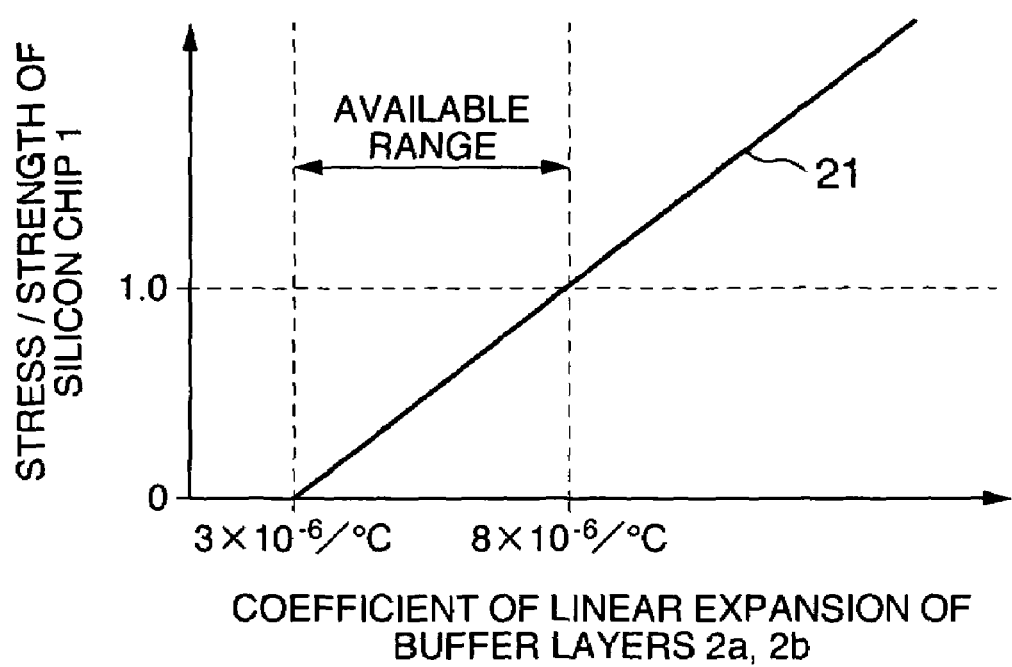
FIG. 2 is a view illustrating the relationship between a coefficient of linear expansion of buffer layers and stress of a silicon chip at the time of heating at 200° C. in the embodiment of the invention.

Stress σ generated in a silicon chip when the semiconductor device is heated is represented by the following formula $$\sigma = E(\alpha 2 - \alpha 1)\Delta T$$

where ΔT indicates a temperature rise, E indicates a Young's modulus of the silicon chip, α1 indicates a coefficient of linear expansion of the silicon chip ($3 \times 10^{-6}$/° C.), and α2 indicates a coefficient of linear expansion of the buffer layers. FIG. 2 illustrates the relationship between a coefficient of linear expansion of the buffer layers and stress of the silicon chip 1 at the time of heating at 200° C. in the embodiment. Stress of the silicon chip on an axis of ordinate in the figure is normalized by a minimum strength of the silicon chip, for which dispersion of the silicon chip in strength is taken account of. When the coefficient of linear expansion of the buffer layers increases, stress of the silicon chip increases. It is found from the figure that when the coefficient of linear expansion of the buffer layers exceeds $8 \times 10^{-6}$/° C., breakage of the silicon chip possibly occurs at the time of heating. Thus, a range indicated by arrows in the figure corresponds to an available range.

Figure 3:
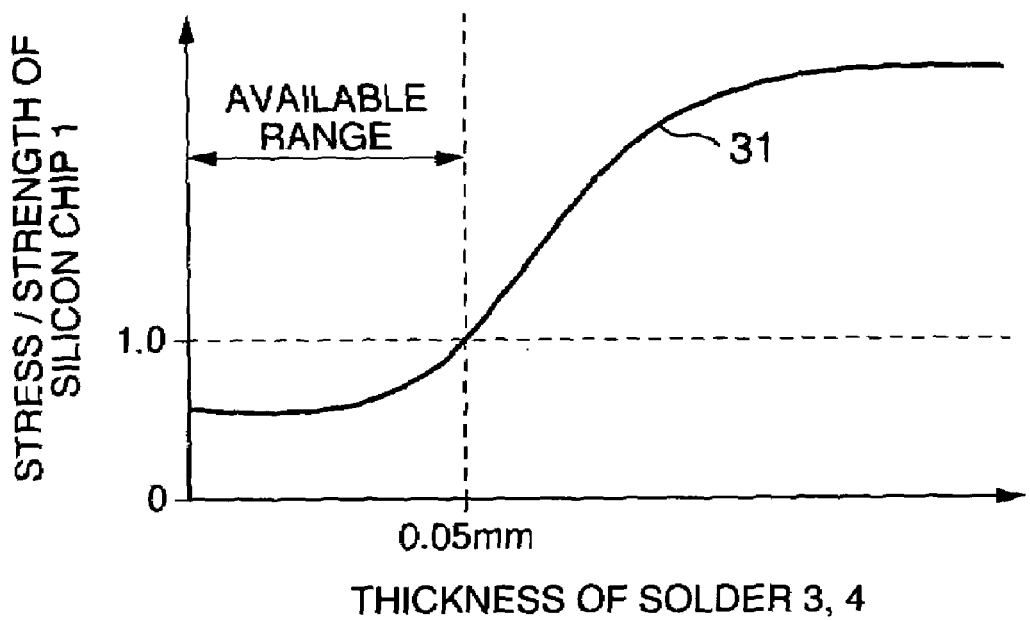
FIG. 3 is a view illustrating the relationship between thicknesses of a solder layer 4 below the silicon chip and a solder layer 3 above the silicon chip and stress of the silicon chip at the time of heating at 200° C. in the embodiment of the invention.

FIG. 3 illustrates the relationship between thicknesses of the solder layer 4 below the silicon chip and the solder layer 3 above the silicon chip and stress of the silicon chip 1 at the time of heating at 200° C. in the embodiment. Stress of the silicon chip on an axis of ordinate in the figure is normalized by strength of the silicon chip in the same manner as in FIG. 1. When the solder layers 3, 4 increase in thickness, the silicon chip increases in stress. The reason for this is that since zinc solder is high in stiffness and large in coefficient of linear expansion ($30 \times 10^{-6}$/° C.), solder itself pulls the silicon chip due to expansion of solder at the time of heating in the case where the solder layers are thick. Stress generated in the silicon chip when the solder layers are thick is represented by the following formula $$\sigma = E(\alpha 3 - \alpha 1)\Delta T$$

where ΔT indicates a temperature rise, E indicates a Young's modulus of the silicon chip, α1 indicates a coefficient of linear expansion of the silicon chip, and α3 indicates a coefficient of linear expansion of the solder. When the buffer layers 2a, 2b have a coefficient of linear expansion of $8 \times 10^{-6}$/° C., stress of the silicon chip is less than fracture stress and the silicon chip is not broken provided that the solder layers have a thickness of not more than 0.05 mm. A range indicated by arrows in the figure corresponds to an available range.

Figure 4:
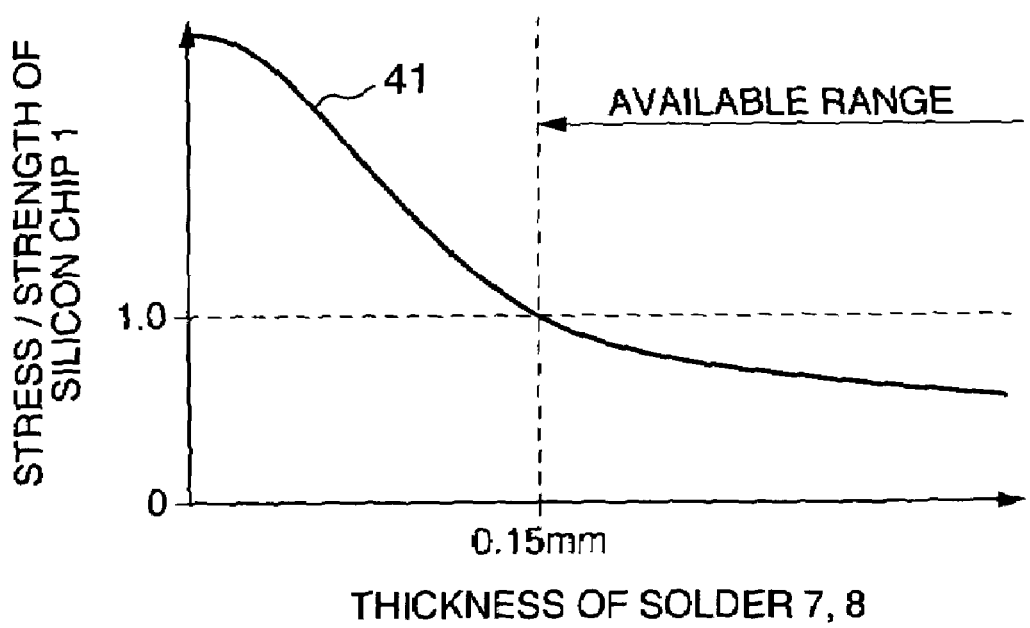
FIG. 4 is a view illustrating the relationship between thicknesses of a solder layer 8 below a buffer layer and a solder layer 7 above a buffer layer and stress of the silicon chip at the time of heating at 200° C. in the embodiment of the invention.

FIG. 4 illustrates the relationship between thicknesses of the solder layer 8 below the buffer layer and the solder layer 7 above the buffer layer and stress of the silicon chip 1 at the time of heating at 200° C. in the embodiment. Stress of the silicon chip on an axis of ordinate in the figure is normalized by strength of the silicon chip in the same manner as in FIG. 1. When the solder layers 7, 8 increase in thickness, the silicon chip decreases in stress. The reason for this is that since there is a large difference in coefficient of linear expansion between the lead 5, the base 6 and the silicon chip 1, thermal deformation of the lead 5 and the base 6 is transmitted to the buffer layers 2a, 2b and further to the solder layers 3, 4 above and below the silicon chip to pull the silicon chip in the case where the solder layers are thin. When the solder layers 7, 8 have a thickness of not less than 0.15 mm, stress of the silicon chip is less than fracture stress and the silicon chip is not broken. A range indicated by arrows in the figure corresponds to an available range.

Figure 5:
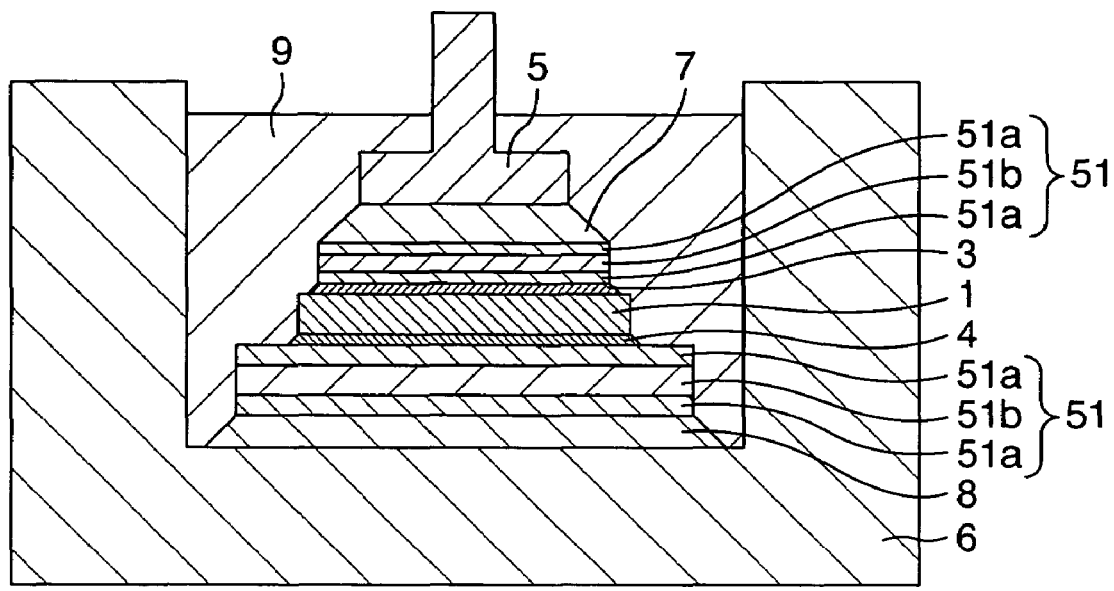
FIG. 5 is a cross sectional view showing a semiconductor device according to a further embodiment of the invention.

FIG. 5 shows a cross section of a semiconductor device according to a further embodiment of the invention. In the embodiment, laminated materials CIC comprised of three layers of Cu/Invar/Cu are joined as buffer layers to above and below a silicon chip 1 with solder layers 3, 4 therebetween. In case of using the CIC, it is required that by regulating a ratio of thicknesses of Fe-36% Ni (iron-36% nickel) alloy (a common name of Invar, having a coefficient of linear expansion of $1.7 \times 10^{-6}$/° C.) and copper (Cu), the whole CIC be adjusted to have a coefficient of linear expansion between $3 \times 10^{-6}$/° C. and $8 \times 10^{-6}$/° C. Alternatively, it is required that by annealing the whole CIC at a high temperature around 500° C. to decrease the yield stress and the hardness of copper, the whole CIC be adjusted to have a coefficient of linear expansion between $3 \times 10^{-6}$/° C.

and $8\times10^{-6}/°$ C. The coefficient $\alpha$ of linear expansion of the whole CIC is represented by the following formula using a Young's modulus E4 of copper, a coefficient $\alpha$4 of linear expansion of copper, a thickness t4 of copper, a Young's modulus E5 of Invar, a coefficient $\alpha$5 of linear expansion of Invar, and a thickness t5 of Invar.

$$\alpha=(t4\ E4\ \alpha4+t5\ E5\ \alpha5)/(t4\ E4+t5\ E5)$$

Figure 6:
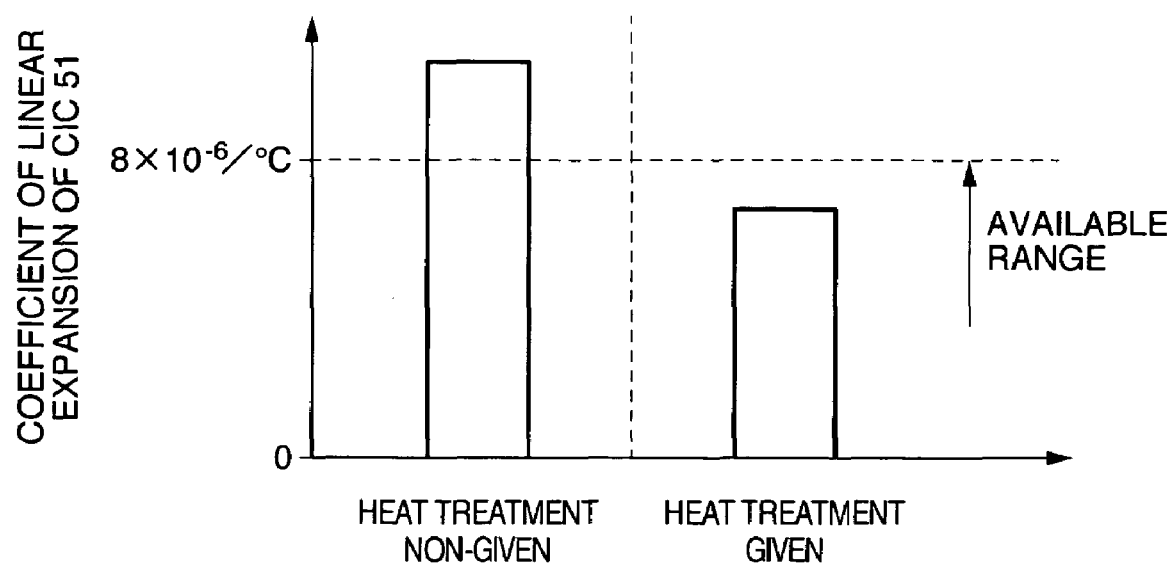
FIG. 6 is a view illustrating the relationship between an equivalent coefficient of linear expansion of a whole CIC disk and heat treatment in the further embodiment of the invention.

FIG. 6 illustrates the relationship between a coefficient of linear expansion of the whole CIC disk, or an equivalent coefficient of linear expansion, and heat treatment in the embodiment. The CIC disk used here has a ratio of thicknesses of copper, Invar, and copper being 1:1:1. While an equivalent coefficient of linear expansion of a CIC disk being not subjected to heat treatment was $11\times10^{-6}/°$ C. (indicated by a bar chart on the left in the figure), the equivalent coefficient of linear expansion was decreased to $7\times10^{-6}/°$ C. by subjecting the CIC disk to annealing (indicated by a bar chart on the right in the figure). As a result, there can be obtained buffer layers, which do not break a silicon chip at the time of heating at 200° C., on the basis of the relationship shown in FIG. 2. A range indicated by arrows in the figure corresponds to an available range.

Figure 7:
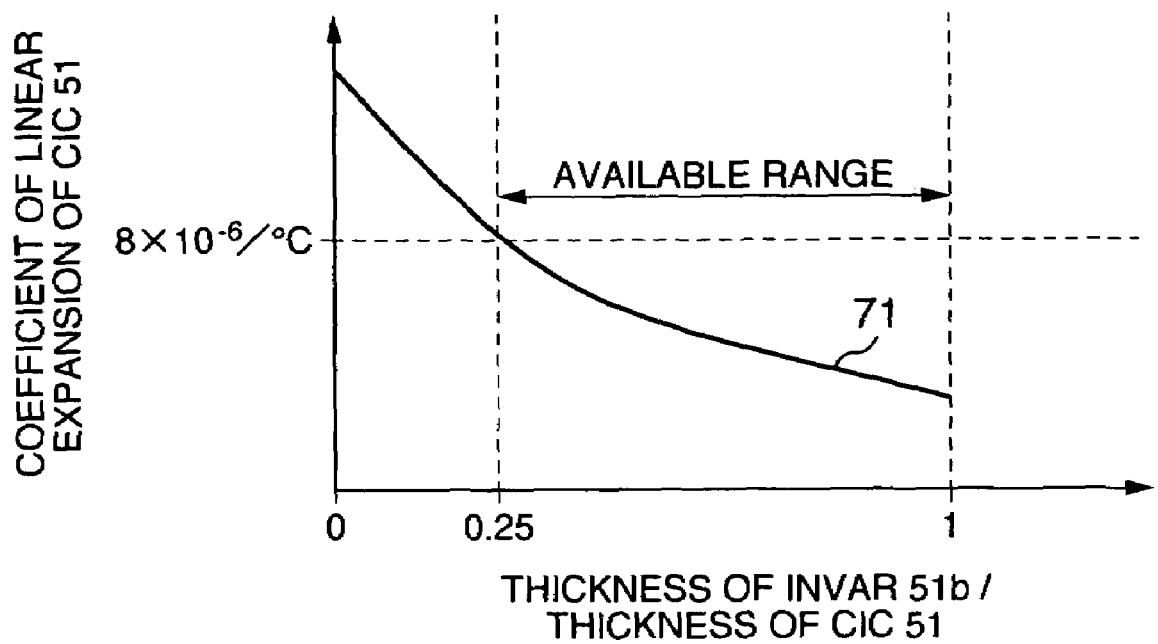
FIG. 7 is a view illustrating the relationship between an equivalent coefficient of linear expansion of a CIC disk and a thickness of Invar in a further embodiment of the invention.

FIG. 7 illustrates the relationship between an equivalent coefficient of linear expansion of the CIC disk and a thickness of Invar in the embodiment. In the figure, the thickness of Invar is normalized by the use of a thickness of the CIC. When Invar is increased in thickness, an equivalent coefficient of linear expansion of the CIC decreases, and thus the equivalent coefficient of linear expansion of the CIC can be controlled by changing a thickness of Invar. In the case where annealing is performed at 500° C., an equivalent coefficient of linear expansion of the CIC becomes $8\times10^{-6}/°$ C. provided that a ratio of a thickness of Invar to a thickness of the CIC is at least 0.25, and thus there can be obtained buffer layers, which do not break a silicon chip at the time of heating at 200° C., on the basis of the relationship shown in FIG. 2. A range indicated by arrows in the figure corresponds to an available range.

Figure 8:
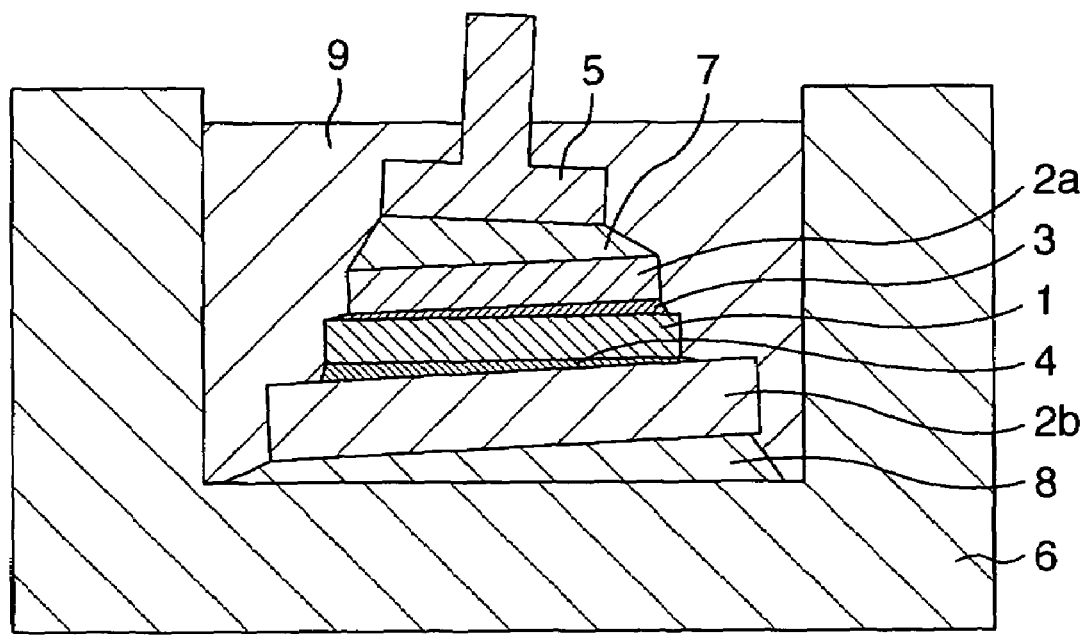
FIG. 8 is a cross sectional view showing a semiconductor device according to a further embodiment of the invention.

FIG. 8 shows a cross section of a semiconductor device according to a further embodiment of the invention. The construction of the embodiment is the same as that in FIG. 1 but different from the latter in that joined members such as a silicon chip, buffer layers, and a lead are inclined and respective solder layers involve dispersion in thickness. Even when the joined members are inclined, as far as an extreme inclination is not generated to produce a region devoid of a solder layer between a silicon chip and a buffer layer, between a buffer layer and a lead, or between a buffer layer and a base, the silicon chip will not be cracked provided that solder layers between a silicon chip and buffer layers have an average thickness of not more than 0.05 mm and solder layers between a buffer layer and a lead and between a buffer layer and a base have an average thickness of not less than 0.15 mm.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor device comprising:
   a silicon chip having a rectifying function;
   an upper, conductive buffer layer having a low coefficient of linear expansion and joined to an upper side of the silicon chip through a Pb-free solder containing no Pb;
   a lower, conductive buffer layer having a low coefficient of linear expansion and joined to a lower side of the silicon chip through a Pb-free solder containing no Pb;
   a conductive lead joined to an upper side of the upper buffer layer through a Pb-free solder containing no Pb; and
   a conductive base joined to a lower side of the lower buffer layer through a Pb-free solder containing no Pb,
   wherein the solder on the upper and lower sides of the silicon chip has a thickness of not more than 0.05 mm,
   wherein the solder on the upper side of the upper buffer layer has a thickness of not less than 0.15 mm, and the solder on the lower side of the lower buffer layer has a thickness of not less than 0.15 mm, and wherein the Pb-free solder containing no Pb has a melting point of not less than 250° C.

2. The semiconductor device according to claim 1, wherein the upper buffer layer and the lower buffer layer have a coefficient of linear expansion of not less than $3\times10^{-6}/°$ C. and not more than $8\times10^{-6}/°$ C.

3. The semiconductor device according to claim 2, wherein the Pb-free solder containing no Pb is an alloy made of at least one of zinc, bismuth, copper, tin, and silver.

4. The semiconductor device according to claim 3, wherein the upper buffer layer and the lower buffer layer are made of molybdenum, tungsten, iron-nickel alloy, or a laminated plate composed of iron-nickel alloy and copper.

5. The semiconductor device according to claim 2, wherein the upper buffer layer and the lower buffer layer are made of molybdenum, tungsten, iron-nickel alloy, or a laminated plate composed of iron-nickel alloy and copper.

6. The semiconductor device according to claim 1, wherein the Pb-free solder containing no Pb is an alloy made of at least one of zinc, bismuth, copper, tin, and silver.

7. The semiconductor device according to claim 6, wherein the upper buffer layer and the lower buffer layer are made of molybdenum, tungsten, iron-nickel alloy, or a laminated plate composed of iron-nickel alloy and copper.

8. The semiconductor device according to claim 1, wherein the upper buffer layer and the lower buffer layer are made of molybdenum, tungsten, iron-nickel alloy, or a laminated plate composed of iron-nickel alloy and copper.

* * * * *